United States Patent
Obinata et al.

(10) Patent No.: US 6,290,826 B1
(45) Date of Patent: *Sep. 18, 2001

(54) COMPOSITE SPUTTERING CATHODE ASSEMBLY AND SPUTTERING APPARATUS WITH SUCH COMPOSITE SPUTTERING CATHODE ASSEMBLY

(75) Inventors: Hisaharu Obinata; Morohisa Tamura, both of Suyama Susono; Yasushi Higuchi; Takashi Komatsu, both of Chiba, all of (JP)

(73) Assignee: Nihon Shinku Gijutsu Kabushiki Kaisha, Chigasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/954,207

(22) Filed: Oct. 20, 1997

(30) Foreign Application Priority Data

Oct. 21, 1996 (JP) .................................................. 8-297742
May 14, 1997 (JP) .................................................. 9-139237
Sep. 22, 1997 (JP) .................................................. 9-275283

(51) Int. Cl.$^7$ .............................. C23C 14/00; C25B 9/00; C25B 11/00; C25B 13/00
(52) U.S. Cl. .............................. 204/298.28; 204/298.11; 204/298.23; 204/298.26
(58) Field of Search .................... 204/298.08, 298.11, 204/298.13, 298.23, 298.28, 298.26

(56) References Cited

U.S. PATENT DOCUMENTS

| | | | |
|---|---|---|---|
| 3,864,239 | * | 2/1975 | Fletcher et al. ............... 204/298.26 |
| 4,313,815 | * | 2/1982 | Graves, Jr. et al. ............ 204/298 |
| 4,929,320 | * | 5/1990 | Yamada et al. ................ 204/192.2 |
| 4,981,566 | * | 1/1991 | Wurczinger .................. 204/192.13 |
| 5,196,101 | * | 3/1993 | Thakoor ...................... 204/192.26 |
| 5,441,615 | * | 8/1995 | Mukai ........................ 204/192.12 |
| 5,527,438 | * | 6/1996 | Tepman ....................... 204/192.12 |
| 5,597,462 | | 1/1997 | Cho .......................... 204/298.11 |
| 5,605,608 | * | 2/1997 | Pepi et al. .................. 204/192.12 |
| 5,635,036 | * | 6/1997 | Demaray et al. .............. 204/192.12 |
| 5,650,052 | * | 7/1997 | Edelstein et al. ............ 204/192.12 |
| 5,705,042 | * | 1/1998 | Leiphart et al. ............. 204/192.12 |
| 5,711,858 | * | 1/1998 | Kontra et al. ............... 204/192.15 |
| 5,728,276 | * | 3/1998 | Katsuki et al. .............. 204/298.11 |

FOREIGN PATENT DOCUMENTS 2 573 441     5/1986   (FR) .
1-319671   * 12/1989   (JP) .
9 605 377     6/1996   (KR) .

* cited by examiner

*Primary Examiner*—Stephen Kalafut
*Assistant Examiner*—Julian A. Mercado
(74) *Attorney, Agent, or Firm*—Armstrong, Westerman, Hattori, McLeland & Naughton, LLP

(57) ABSTRACT

A sputtering apparatus includes a vacuum housing, a substrate holder disposed in the vacuum housing for holding a substrate thereon, and a composite sputtering cathode assembly disposed in the vacuum housing. The composite sputtering cathode assembly has a plurality of targets and a plurality of shields each disposed between adjacent ones of the targets. The targets are disposed in confronting relation to the substrate held on the substrate holder. Those sputtering particles expelled from the targets which are directed obliquely to the substrate hit the shields and do not reach the substrate. Only those sputtering particles which are directed substantially perpendicularly to the substrate are applied to the substrate. The distribution of film thicknesses on the substrate is made uniform when the substrate and the targets rotate relatively to each other.

20 Claims, 11 Drawing Sheets

FIG.10
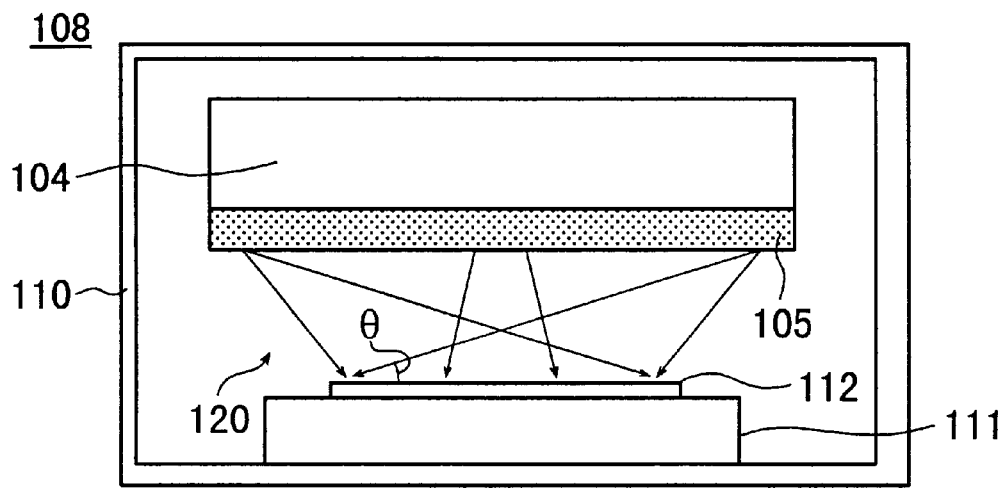
FIG.11
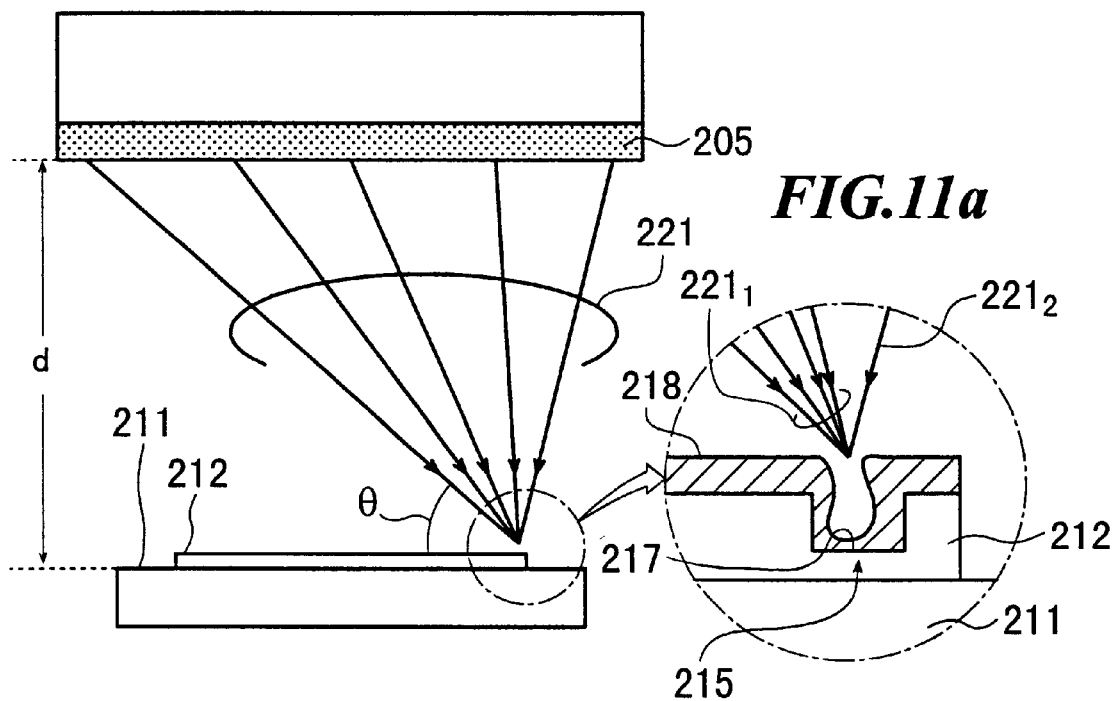
FIG.11a

COMPOSITE SPUTTERING CATHODE ASSEMBLY AND SPUTTERING APPARATUS WITH SUCH COMPOSITE SPUTTERING CATHODE ASSEMBLY

BACKGROUND OF THE INVENTION

1. Field of the Invention

The present invention relates to the art of sputtering, and more particularly to a composite sputtering cathode assembly having a plurality of targets and a sputtering apparatus having such a composite sputtering cathode assembly. More specifically, the present invention is concerned with the sputtering technology which is capable of forming a thin film in minute holes (hereafter the words "minute holes" include narrow slits) of a high aspect ratio with a good coverage using a composite sputtering cathode assembly.

2. Description of the Prior Art

Sputtering apparatus are widely used in the fabrication of electronic devices such as semiconductor devices and liquid crystal display units.

As shown in FIG. 10 of the accompanying drawings, a conventional sputtering apparatus 108 has a target 105 mounted on a cathode electrode 104 disposed in a vacuum housing 110, and a substrate 112 placed on a substrate holder 111 disposed in the vacuum housing 110 in confronting relation to the target 105. A plasma is generated on the surface of the target 105 to expel the material of the target 105 as sputtering particles which are deposited as a thin film on the surface of the substrate 112.

The substrate 112 and the target 105 are closely spaced from each other by a distance of about 6 cm. Therefore, the sputtering particles are applied to the surface of the substrate 112 at various angles as indicated by the arrow 120. Therefore, the minimum angle θ at which the sputtering particles are applied to the surface of the substrate 112 is very small at ends of the substrate 112.

Recent years have seen an increase in the degree of integration of electronic devices such as semiconductor devices. Because of such an increased degree of integration, minute holes defined in substrate surfaces of such electronic devices have increased aspect ratios (depth-to-diameter ratios).

When a thin film is deposited on a substrate having minute holes with a high aspect ratio by the conventional sputtering apparatus, a thin-film overhang is developed at the open ends of the minute holes, and no sufficient thin film is produced at the bottom ends of the minute holes.

One solution which has heretofore been proposed is shown in FIGS. 11 and 11a of the accompanying drawings. As shown in FIG. 11, the distance "d" between a target 205 and a substrate 212 is increased, and a high vacuum is developed to increase the mean free path of sputtering particles, for thereby increasing the minimum angle θ at which the sputtering particles are applied to the surface of the substrate 212.

However, the increased distance "d" between the target 205 and the substrate 212 is not sufficient to deposit a thin film on the bottom of a minute hole 215 at an end of the substrate 212 with a uniform coverage.

Specifically, sputtering particles expelled from a large surface area of the target 205, ranging from the right end to the left end as shown in FIG. 11, reach the substrate 212 as indicated by the arrows 221. As shown in FIG. 11a, on the right end of the substrate 212, more sputtering particles arrive at the right-hand side of the minute hole 215 as indicated by the arrows $221_1$, and less sputtering particles arrive at the left-hand side of the minute hole 215 as indicated by the arrow $221_2$. Therefore, a thin film 218 deposited on the bottom of the minute hole 215 is thicker at the right-hand side and thinner at the left-hand side, and hence the coverage by the thin film 218 of the bottom of the minute hole 215 is asymmetric (known as a step coverage).

The asymmetry of the coverage by the thin film 218 of the bottom of the minute hole 215 can be eliminated if the distance "d" between the target 205 and the substrate 212 is further increased to allow the sputtering particles to be applied perpendicularly to the substrate 212. However, the further increase in the distance "d" reduces the number of sputtering particles that reach the substrate 212, resulting in a reduction in the film growth rate.

FIG. 12 of the accompanying drawings shows another conventional sputtering apparatus 302. The conventional sputtering apparatus 302 has a target 305 mounted on a cathode electrode 304 disposed in a vacuum housing 310, and a collimator 307 disposed between the target 305 and a substrate holder 311 disposed in the vacuum housing 310 in confronting relation to the target 305. Sputtering particles expelled in various directions indicated by the arrow 320 from the target 305 are applied to the collimator 307. The collimator 307 passes only those sputtering particles that are directed perpendicularly as indicated by the arrow 327 to a substrate 312 supported on the substrate holder 311, and entraps those sputtering particles that are directed in other directions toward the substrate 312, for thereby depositing a thin film in minute holes in the substrate 312 with a uniform coverage at their bottom ends.

However, as the number of sputtering particles entrapped by the collimator 307 increases, the openings of the collimator 307 are constricted and progressively limit the number of sputtering particles that can travel through the collimator 307, resulting in a reduction in the film growth rate.

If the target 305 is increased in diameter, then the plasma developed on the surface of the target 305 suffers large density irregularities, and hence the sputtering rate on the surface of the target 305 differs greatly depending on the position on the surface of the target 305.

SUMMARY OF THE INVENTION

It is therefore an object of the present invention to provide a composite sputtering cathode assembly capable of forming a thin film in minute holes in a substrate with a symmetric coverage at bottom ends of the minute holes.

Another object of the present invention is to provide a sputtering apparatus which employs such a composite sputtering cathode assembly.

According to the present invention, a composite sputtering cathode assembly includes a plurality of targets and a plurality of shields each disposed between adjacent ones of the targets.

Those sputtering particles expelled from the targets which are directed obliquely to the substrate hit the shields and do not reach the substrate. Therefore, sputtering particles that are applied to the substrate strike the substrate at a large minimum angle, i.e., substantially perpendicularly to the substrate.

The shields have tip ends spaced from a surface of the targets by a distance which is at least the diameter of the targets.

It is thus possible to form a thin film with a highly symmetric bottom coverage of 50% in minute holes in the substrate which have an aspect ratio of 2, for example.

The shields may comprise tubular sleeves, respectively, the targets being surrounded by the tubular sleeves, respectively.

The targets may include a target of different materials.

If targets of different materials are sputtered simultaneously, then a thin film of alloy can be deposited on the substrate. If targets of different materials are sputtered separately, then a multilayer thin film can be deposited on the substrate. If targets of different materials are switched for sputtering, then a thin film of different materials transversely across the thin film can be deposited on the substrate.

According to the present invention, a sputtering apparatus includes a vacuum housing, a substrate holder disposed in the vacuum housing for holding a substrate thereon, and a composite sputtering cathode assembly disposed in the vacuum housing, the composite sputtering cathode assembly comprising a plurality of targets and a plurality of shields each disposed between adjacent ones of the targets, the targets being disposed in confronting relation to the substrate held on the substrate holder.

The substrate holder and the composite sputtering cathode assembly may lie parallel each other and may be rotatable relatively to each other.

Minute holes in the substrate which have a high aspect ratio are filled with a thin film with a good bottom coverage. The distribution of film thicknesses on the substrate is made uniform when the substrate and the targets rotate relatively to each other.

When the substrate and the targets rotate relatively to each other, the surface of the substrate passes through effective areas below the target, resulting in a better bottom coverage and an increased distribution of film thicknesses.

The sputtering apparatus may further comprise means for supplying different amounts of electric energy to at least two of the targets.

The bottom coverage and the distribution of film thicknesses can be controlled by controlling the amounts of electric energy supplied to the targets.

The above and other objects, features, and advantages of the present invention will become apparent from the following description when taken in conjunction with the accompanying drawings which illustrate preferred embodiments of the present invention by way of example.

BRIEF DESCRIPTION OF THE DRAWINGS

FIG. 1b is a vertical cross-sectional view taken along line Ib—Ib of FIG. 1a;

FIG. 10 is a vertical cross-sectional view of a conventional sputtering apparatus;

FIG. 11 is a vertical cross-sectional view illustrative of a step coverage;

FIG. 11a is an enlarged view of an encircled portion shown in FIG. 11; and

DETAILED DESCRIPTION OF THE PREFERRED EMBODIMENTS

Figure 1A:
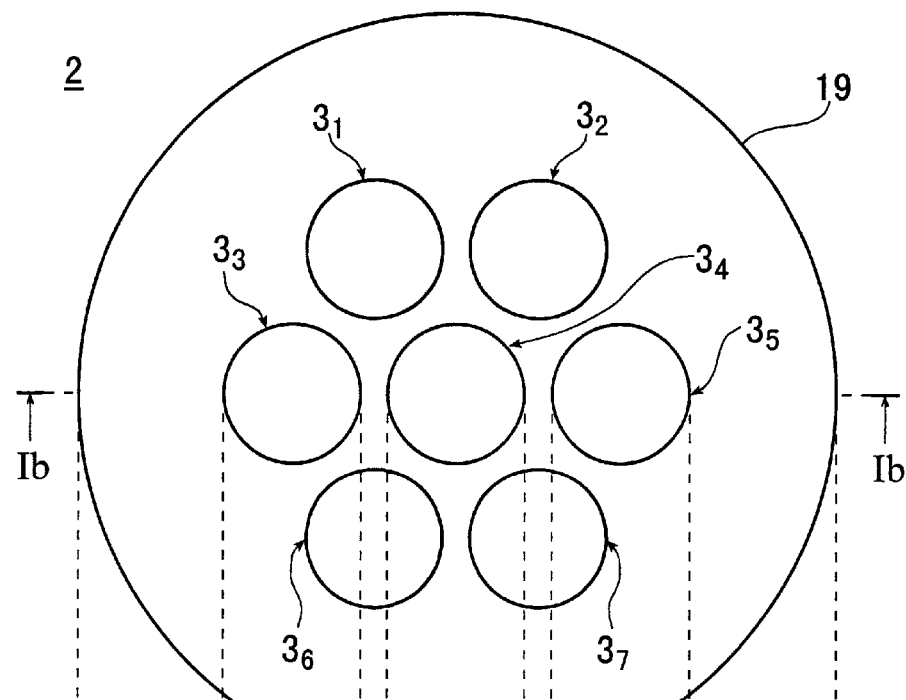
FIG. 1a is a plan view of a sputtering apparatus according to a first embodiment of the present invention.
Figure 1B:
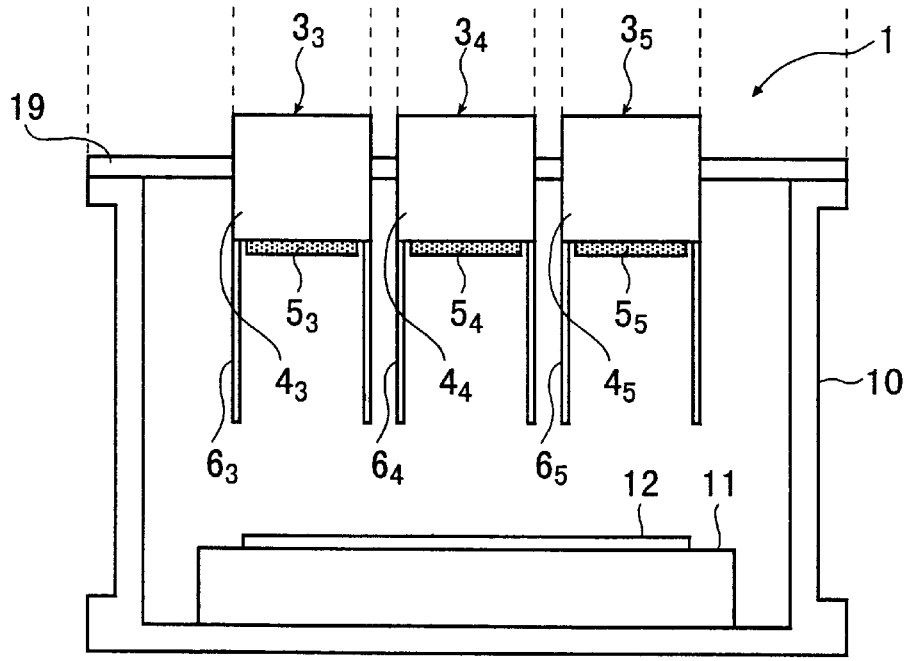

As shown in FIGS. 1a and 1b, a sputtering apparatus 2 according to a first embodiment of the present invention generally comprises a vacuum housing 10 and a cathode holder 19 disposed on an upper end panel of the vacuum housing 10. The vacuum housing 10 is connected to a vacuum pump (not shown), and can be evacuated thereby.

A substrate holder 11 is mounted on a bottom end panel of the vacuum housing 10 and placed in the vacuum housing 10. The cathode holder 19 supports a plurality of (seven in the illustrated embodiment) sputtering cathodes $3_1$~$3_7$ that are electrically insulated from the vacuum housing 10 which is held at a ground potential. The cathode holder 19 and the sputtering cathodes $3_1$~$3_7$ jointly make up a composite sputtering cathode assembly 1.

The sputtering cathodes $3_1$~$3_7$ comprise respective cathode electrodes $4_1$~$4_7$, respective targets $5_1$~$5_7$, and tubular sleeves $6_1$~$6_7$. The cathode electrodes $4_1$~$4_7$ have respective magnetron magnets disposed therein.

The targets $5_1$~$5_7$ are fixed respectively to lower ends of the cathode electrodes $4_1$~$4_7$, and the tubular sleeves $6_1$~$6_7$ have respective lower end openings directed downwardly and are fixed to the respectively lower ends of the cathode electrodes $4_1$~$4_7$ in surrounding relation to the targets $5_1$~$5_7$, respectively. The tubular sleeves $6_1$~$6_7$ axially extend substantially perpendicularly to the targets $5_1$~$5_7$.

Figure 3A:
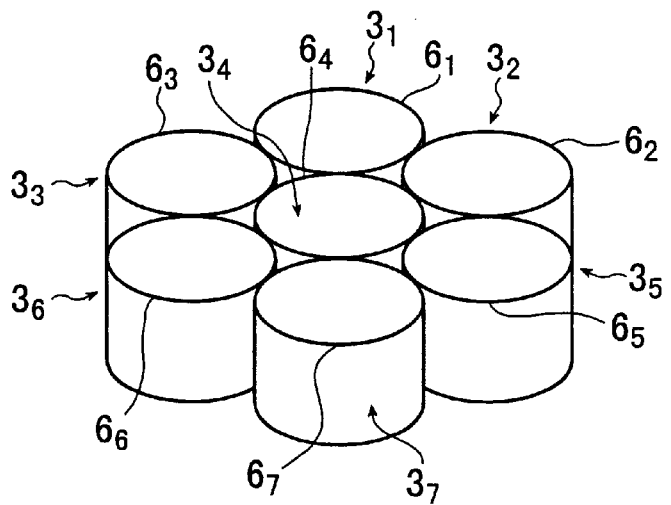
FIG. 3a is a perspective view of a composite sputtering cathode assembly having cylindrical sputtering cathodes.

The sputtering cathodes $3_1$~$3_7$ are positioned relatively to each other as shown in FIG. 3a. As shown in FIG. 3a, one of the sputtering cathodes $3_4$ is positioned centrally in the composite sputtering cathode assembly 1, and surrounded by the other sputtering cathodes $3_1$~$3_3$, $3_5$~$3_7$ that are positioned on a circular pattern equidistantly from the central sputtering cathode $3_4$.

The targets $5_1$~$5_7$ are made of the same metal material, and lie substantially parallel to the substrate holder 11 in confronting relation thereto. When a substrate 12 is placed on the substrate holder 11, therefore, the substrate 12 lies substantially parallel to the targets $5_1$~$5_7$.

Electric energy can be supplied individually to the targets $5_1$~$5_7$ of the sputtering cathodes $3_1$~$3_7$. It is possible to vary the amount of electric energy supplied individually to the targets $5_1$~$5_7$, and to energize only desired ones of the targets $5_1$~$5_7$ for sputtering.

In operation, the substrate 12 is placed on the substrate holder 11, and the vacuum housing 10 is evacuated to a high vacuum. Thereafter, a sputtering gas is introduced into the vacuum housing 10, and a DC voltage is applied to each of the sputtering cathodes $3_1$~$3_7$ while the vacuum housing 10 is being held at a pressure on the order of $10^{-4}$ Torr. When the DC voltage is applied to the cathode electrodes $4_1$~$4_7$, high-density plasmas are developed individually on the surfaces of the targets $5_1$~$5_7$ due to the magnetic fields of the magnetron magnets, for thereby sputtering the targets $5_1$~$5_7$.

Figure 2:
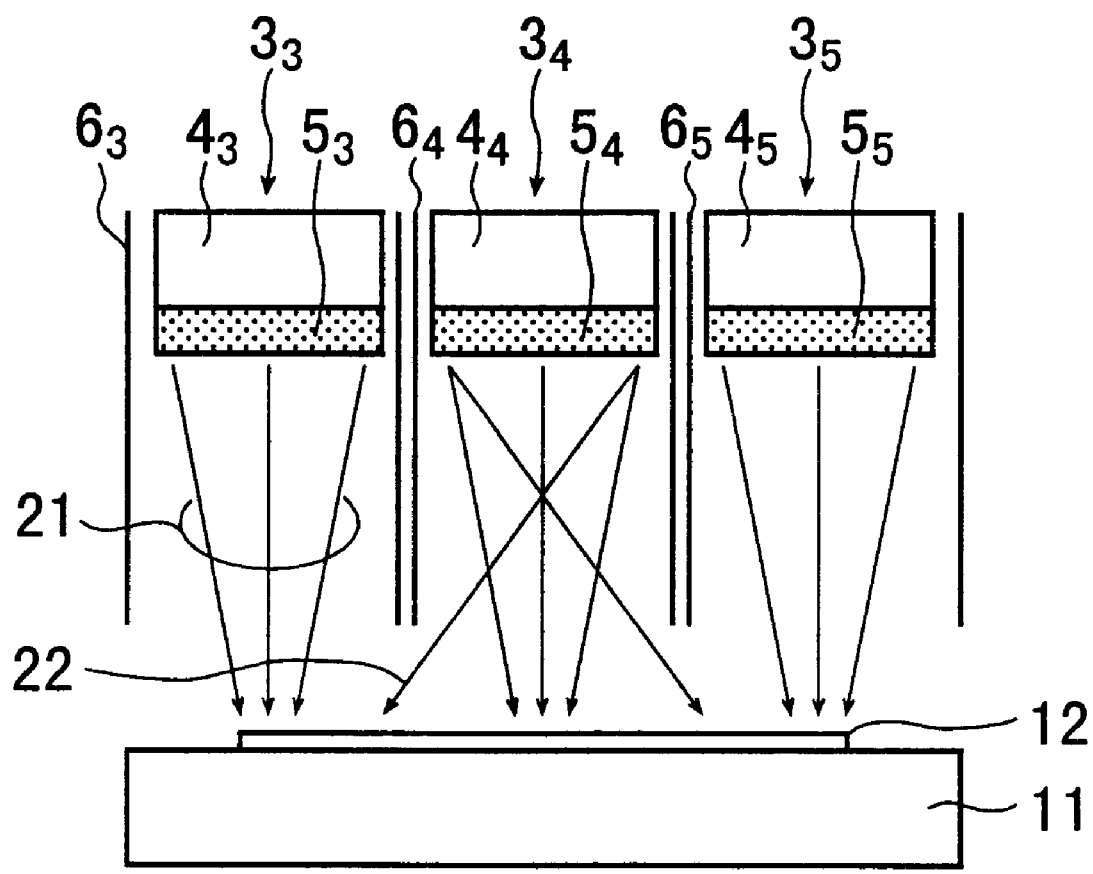
FIG. 2 is a vertical cross-sectional view showing the manner in which sputtering particles are applied to a substrate in the sputtering apparatus shown in FIGS. 1a and 1b.

Sputtering particles are now expelled from the targets $5_1$~$5_7$. Those sputtering particles which are obliquely expelled from the targets $5_1$~$5_7$ are applied to and deposited on the wall surfaces of the tubular sleeves $6_1$~$6_7$ and do not reach the substrate 12. Only those sputtering particles, indicated by 21 in FIG. 2, which are expelled substantially perpendicularly from the targets $5_1$~$5_7$ reach the substrate 12, depositing a thin film on the surface of the substrate 12.

In an experiment, each of the targets $5_1$~$5_7$ had a diameter of 150 mm, and the surfaces of the targets $5_1$~$5_7$ were spaced from the lower open ends of the tubular sleeves $6_1$~$6_7$ by a distance of 150 mm. When a thin film was deposited on the surface of the substrate 12 which had a diameter of 300 mm, the thin film was deposited in minute holes defined in the substrate 12 and having an aspect rate of 2, with a symmetric bottom coverage of 50% on the bottom ends of the minute holes.

The distance from the lower open ends of the tubular sleeves $6_1$~$6_7$ to the substrate 12 was then changed to about 20 mm. At this time, sputtering particles were applied to the surface of the substrate 12 in areas below adjacent tubular sleeves, as indicated by the arrows 22 in FIG. 2. A thin film was deposited on the surface of the substrate 12 in areas between shields that comprise the tubular sleeves $6_1$~$6_7$, and the deposited thin film had a better thickness distribution than when larger-diameter targets and a collimator were used.

The distance from the lower open ends of the tubular sleeves $6_1$~$6_7$ to the substrate 12 should be as small as possible for better bottom coverage symmetry under conditions that satisfy requirements for achieving a desired film thickness distribution.

Figure 3B:
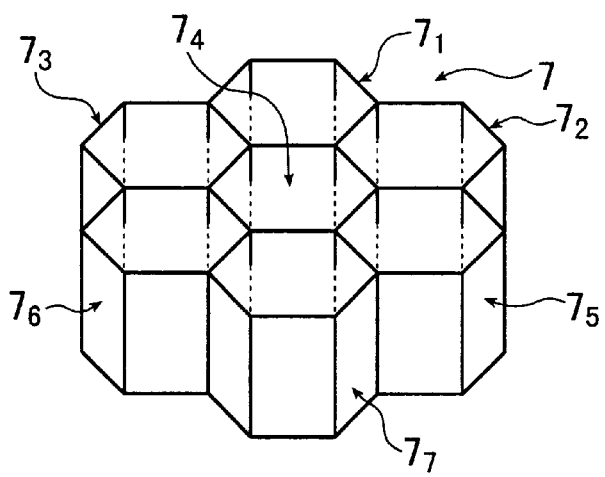
FIG. 3b is a perspective view of a modified composite sputtering cathode assembly having hexagonal prismatic sputtering cathodes.

FIG. 3b shows a modified composite sputtering cathode assembly 7 which is of a honeycomb structure having a plurality of hexagonal prismatic sputtering cathodes $7_1$~$7_7$.

Figure 3C:
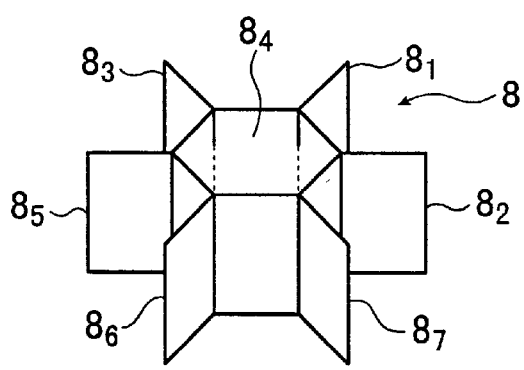
FIG. 3c is a perspective view of another modified composite sputtering cathode assembly having shields.

FIG. 3c illustrates another modified composite sputtering cathode assembly 8. The composite sputtering cathode assembly 8 has a central hexagonal prismatic sputtering cathode $8_4$ and a plurality of radial shields $8_1$~$8_3$, $8_5$~$8_7$ extending radially outwardly from the central hexagonal prismatic sputtering cathode $8_4$. The radial shields $8_1$~$8_3$, $8_5$~$8_7$ are positioned between the targets $5_1$~$5_7$ to isolate them from each other, with spaces between the radial shields $8_1$~$8_3$, $8_5$~$8_7$ being open radially outwardly.

In the above embodiment, the targets $5_1$~$5_7$ are shown as being of the same size as each other. However, a composite sputtering cathode assembly may include differently sized targets. For example, the cathode electrode $4_4$ and the target $5_4$ of the central sputtering cathode $3_4$ may be greater in size and the cathode electrodes $4_1$~$4_3$, $4_5$~$4_7$ and the targets $5_1$~$5_3$, $5_5$~$5_7$ of the surrounding sputtering cathodes $3_1$~$3_3$, $3_5$~$3_7$ may be smaller in size. The targets may be of any of various selected sizes depending on the uniformity of a film thickness distribution and the symmetry of a bottom coverage which are required.

The amounts of electric energy supplied to the sputtering cathodes $3_1$~$3_7$ may be controlled individually or varied depending on the positions of the targets. For example, the amount of electric energy supplied to the central sputtering cathode $3_4$ and the amounts of electric energy supplied to the surrounding sputtering cathodes $3_1$~$3_3$, $3_5$~$3_7$ may be controlled separately from each other. Power supplies may not necessarily be provided for the respective sputtering cathodes. The electric energy to be supplied may be of either a direct current or an alternating current.

The targets may be made of different materials. If the targets are made of different materials, then the amounts of electric energy supplied to the sputtering cathodes may be controlled depending on the materials of the targets. The sputtering cathodes may be arranged such that sputtering particles from targets of different materials will be applied to any position on one substrate.

The distance between the targets $5_1$~$5_7$, each of the diameter of 150 mm, to the substrate 12 may be 15 cm or more, or typically 15 cm or greater and 60 cm or smaller.

As described above, the sputtering apparatus 2 can deposit a thin film in minute holes with a good bottom coverage and also with a uniform film thickness distribution.

Figure 4:
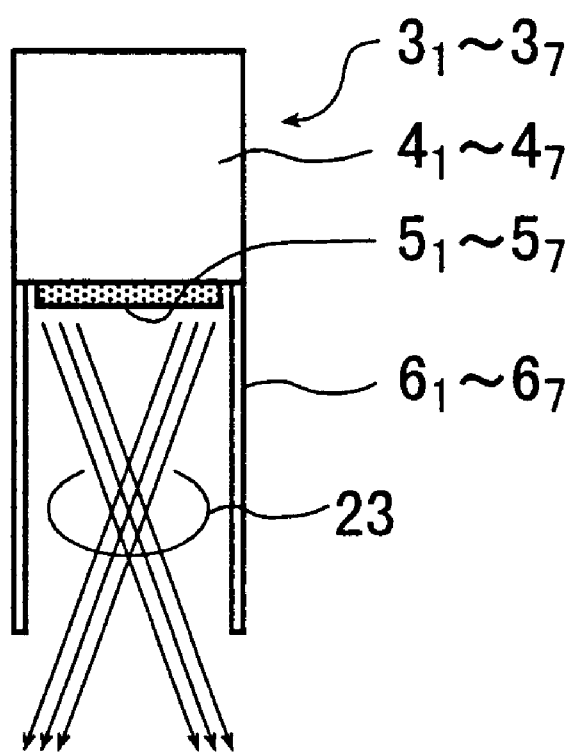
FIG. 4 is a vertical cross-sectional view illustrative of an asymmetric bottom coverage.
Figure 4:
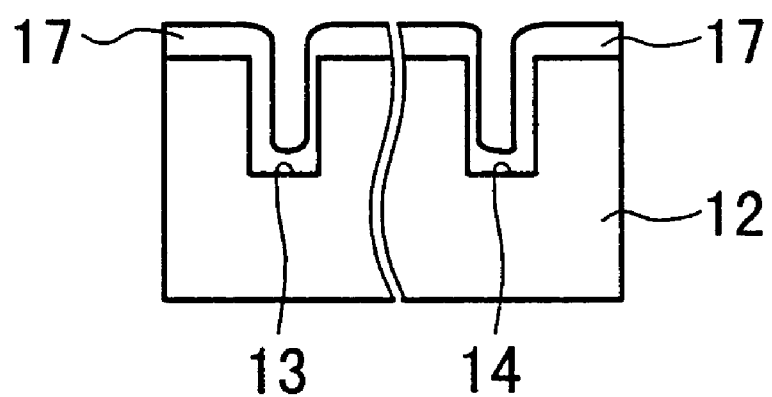

Those minute holes defined in the substrate 12 which are positioned below regions between the sputtering cathodes $3_1$~$3_7$ and do not directly face any sputtering cathodes may suffer a poorer bottom coverage than the other minute holes. For example, as shown in FIG. 4, it is assumed that sputtering particles 23 are emitted from a sputtering cathode that is positioned obliquely to the right of a minute hole 13 in the substrate 12 and obliquely to the left of a minute hole 14 in the substrate 12. Since the emitted sputtering particles 23 enter the minute hole 13 obliquely from the right, a thin film 17 deposited in the minute hole 13 tends to be thicker on the left side and thinner on the right side. Conversely, since the emitted sputtering particles 23 enter the minute hole 14 obliquely from the left, a thin film 17 deposited in the minute hole 14 tends to be thicker on the right side and thinner on the left side.

Figure 5:
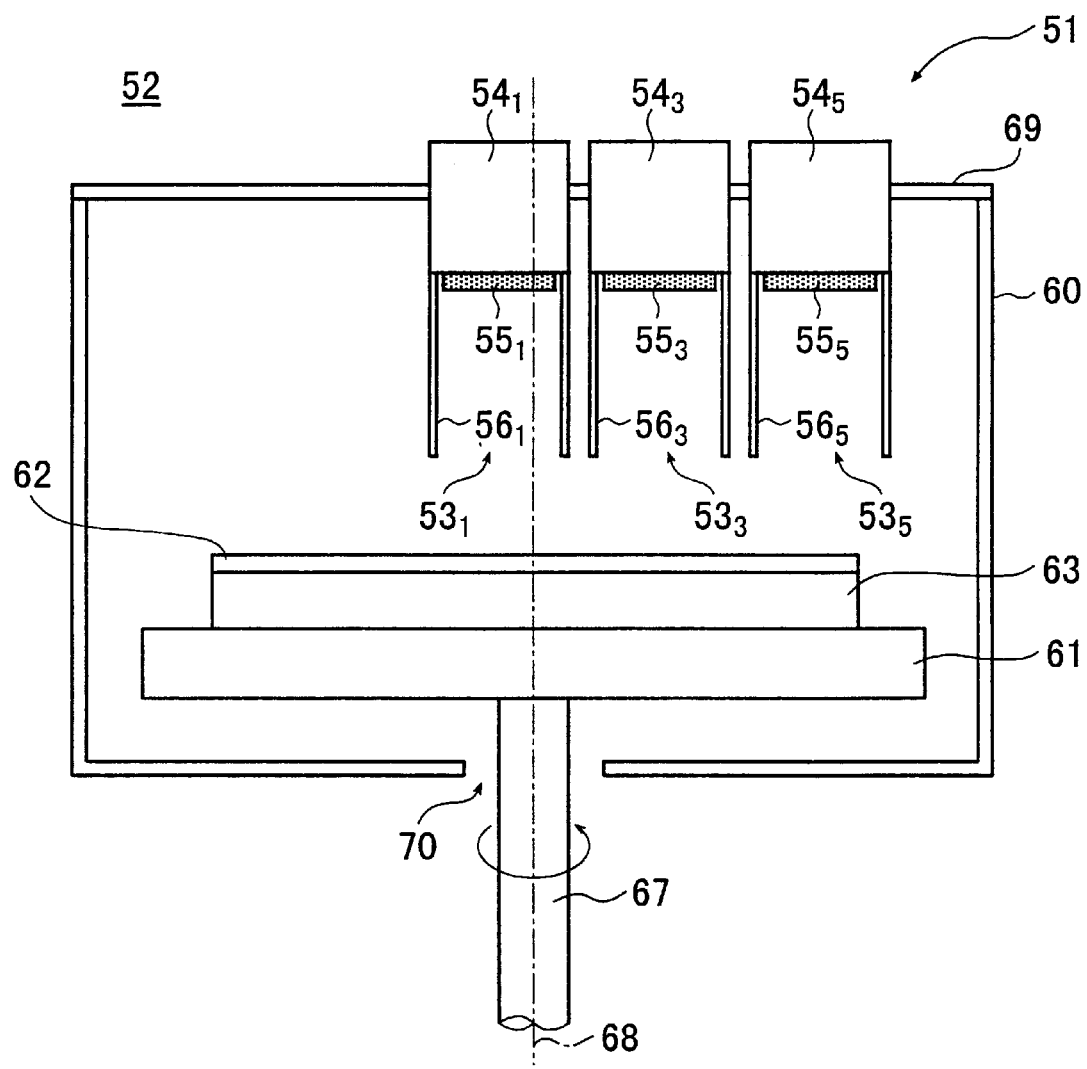
FIG. 5 is a vertical cross-sectional view taken along line V—V of FIG. 6, showing a sputtering apparatus according to a second embodiment of the present invention.

FIG. 5 shows a sputtering apparatus 52 according to a second embodiment of the present invention, which is an improvement over the sputtering apparatus 2 and designed to solve the above problem.

As shown in FIG. 5, the sputtering apparatus 52 generally comprises a vacuum housing 60 and a cathode holder 69 disposed on an upper end of the vacuum housing 60. The vacuum housing 60 is connected to a vacuum pump (not shown), and can be evacuated thereby. The cathode holder 69 supports a plurality of (six in the illustrated embodiment) sputtering cathodes $53_1$~$53_6$ mounted fixedly thereon (only three sputtering cathodes $53_1$, $53_3$, $53_5$ being shown in FIG. 5). The cathode holder 69 and the sputtering cathodes $53_1$~$53_6$ jointly make up a composite sputtering cathode assembly 51. The sputtering cathodes $53_1$~$53_6$ are connected individually to power supplies.

A support base 61 is rotatably disposed in the vacuum housing 60 above a bottom end panel thereof, and a hot plate 63 having a diameter of 200 mm, which is smaller than the diameter of the support base 61, is mounted on the support base 61. A substrate 62 which is of substantially the same diameter as the hot plate 63 is supported on the hot plate 63.

Figure 6:
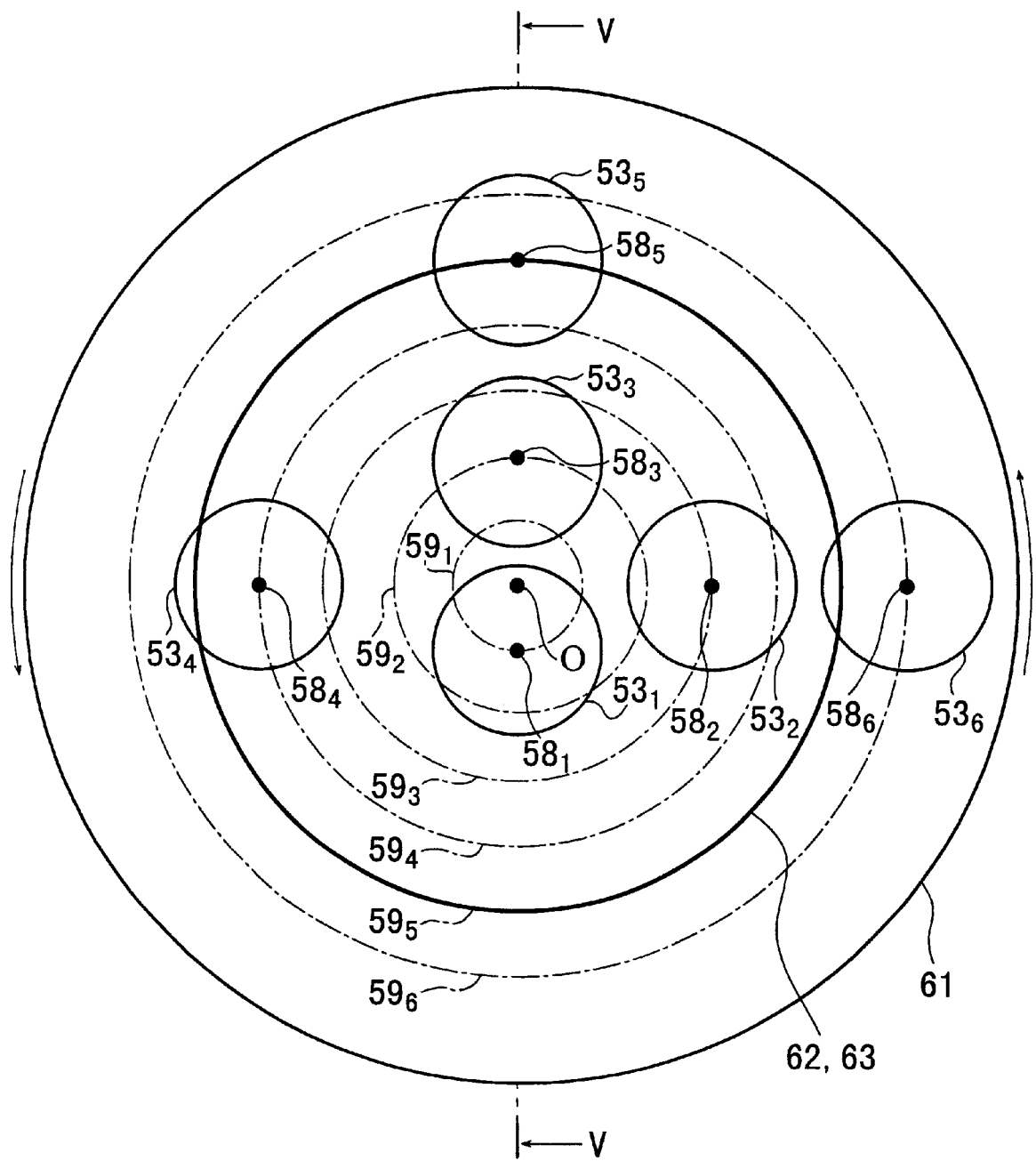
FIG. 6 is a plan view of a composite sputtering cathode assembly of the sputtering apparatus shown in FIG. 5.

The sputtering cathodes $53_1$~$53_6$ and the substrate 62 on the hot plate 63 are positioned relatively to each other as shown in FIG. 6.

The sputtering cathodes $53_1$~$53_6$ have respective cathode electrodes $54_1$~$54_6$ on which respective targets $55_1$~$55_6$ are fixedly mounted parallel to the substrate 61 on the hot plate 63.

The sputtering cathodes $53_1$~$53_6$ also have respective tubular sleeves $56_1$~$56_6$. The tubular sleeves $56_1$~$56_6$ have respective lower open ends directed downwardly and house the targets $55_1$~$55_6$ respectively therein. The targets $55_1$~$55_6$ are thus surrounded by the tubular sleeves $56_1$~$56_6$, respectively, and confront the substrate 62 through the lower open ends of the tubular sleeves $56_1$~$56_6$.

A vertical rotatable shaft 67 has an upper end extending upwardly into the vacuum housing 60 through the bottom end panel thereof, and affixed to the lower surface of the support base 61. The vertical rotatable shaft 67 has a lower end positioned outside of the vacuum housing 60 and coupled to a motor (not shown). When the motor is energized, the vertical rotatable shaft 67 rotates about its own axis 68 thereby to rotate the support base 61 about the axis 68 in a horizontal plane.

When the support base 61 is rotated, the substrate 62 rotates in unison with the hot plate 63 while being kept parallel to the targets $55_1$~$55_6$. A gap 70 between the vacuum housing 60 and the vertical rotatable shaft 70 is sealed by a magnetic fluid to keep the vacuum housing 60 in a vacuum condition while the support base 61 is rotating.

In FIG. 6, when the support base 61 is rotated, the substrate 62 is rotated about a center O aligned with the axis 68 while being kept parallel to the targets $55_1$~$55_6$.

For filling minute holes defined in the surface of the substrate 62 with a thin film using the sputtering apparatus 52, the substrate 62 is placed on the hot plate 63 in axial alignment with the center O, and then the vacuum housing 60 is evacuated. When the vacuum housing 60 is evacuated to a predetermined pressure, a sputtering gas is introduced into the vacuum housing 60. The hot plate 63 is energized to heat the substrate 62 to a certain temperature.

The motor is energized to rotate the substrate 62, and the power supplies connected to the sputtering cathodes $53_1$~$53_6$ are controlled to apply certain voltages to the sputtering cathodes $53_1$~$53_6$. Sputtering gas plasmas are generated in the respective tubular sleeves $56_1$~$56_6$, expelling sputtering particles from the targets $55_1$~$55_6$.

Each of the targets $55_1$~$55_6$ is disk-shaped and has a diameter of about 48 mm. The tubular sleeves $56_1$~$56_6$ have respective lower open ends that are spaced upwardly from the substrate 62 by a predetermined gap or clearance.

In FIG. 6, the reference numerals $59_1$~$59_6$ represent concentric circles around the center O on the substrate 62 which have respective radii of 20, 40, 60, 80, 100, 120 mm. Adjacent ones of the concentric circles $59_1$~$59_6$ are spaced from each other by a distance of 20 mm. The sputtering cathodes $53_1$~$53_6$ are positioned such that their target centers $58_1$~$58_6$ are located vertically upwardly of the respective concentric circles $59_1$~$59_6$.

The targets $55_1$~$55_6$ have radii of 24 mm which are greater than the distance between adjacent ones of the concentric circles $59_1$~$59_6$. Effective regions on the substrate 62 which can be coated with a thin film with a good coverage are positioned directly below the targets $55_1$~$55_6$, respectively, and have a diameter of 40 mm. The effective regions on the substrate 62 have a radius of 20 mm which is equal to the distance between adjacent ones of the concentric circles $59_1$~$59_6$.

Therefore, any point on the surface of the substrate 62 passes through an effective region which is located below and confronts at least one of the targets $55_1$~$55_6$.

When the surface of the substrate 62 passes through the effective region in confronting relation to the targets $55_1$~$55_6$ sputtering particles are applied perpendicularly to the surface of the substrate 62, and therefore the sputtering particles are deposited on the bottom ends of the minute holes in the substrate 62 and fill them uniformly with a thin film. Therefore, the uniformity of the distribution of film thicknesses and bottom coverage are increased.

The thin film was deposited in minute holes defined in the substrate 62 and having an aspect rate of 5, with a symmetric bottom coverage of 50% on the bottom ends of the minute holes.

Figure 7:
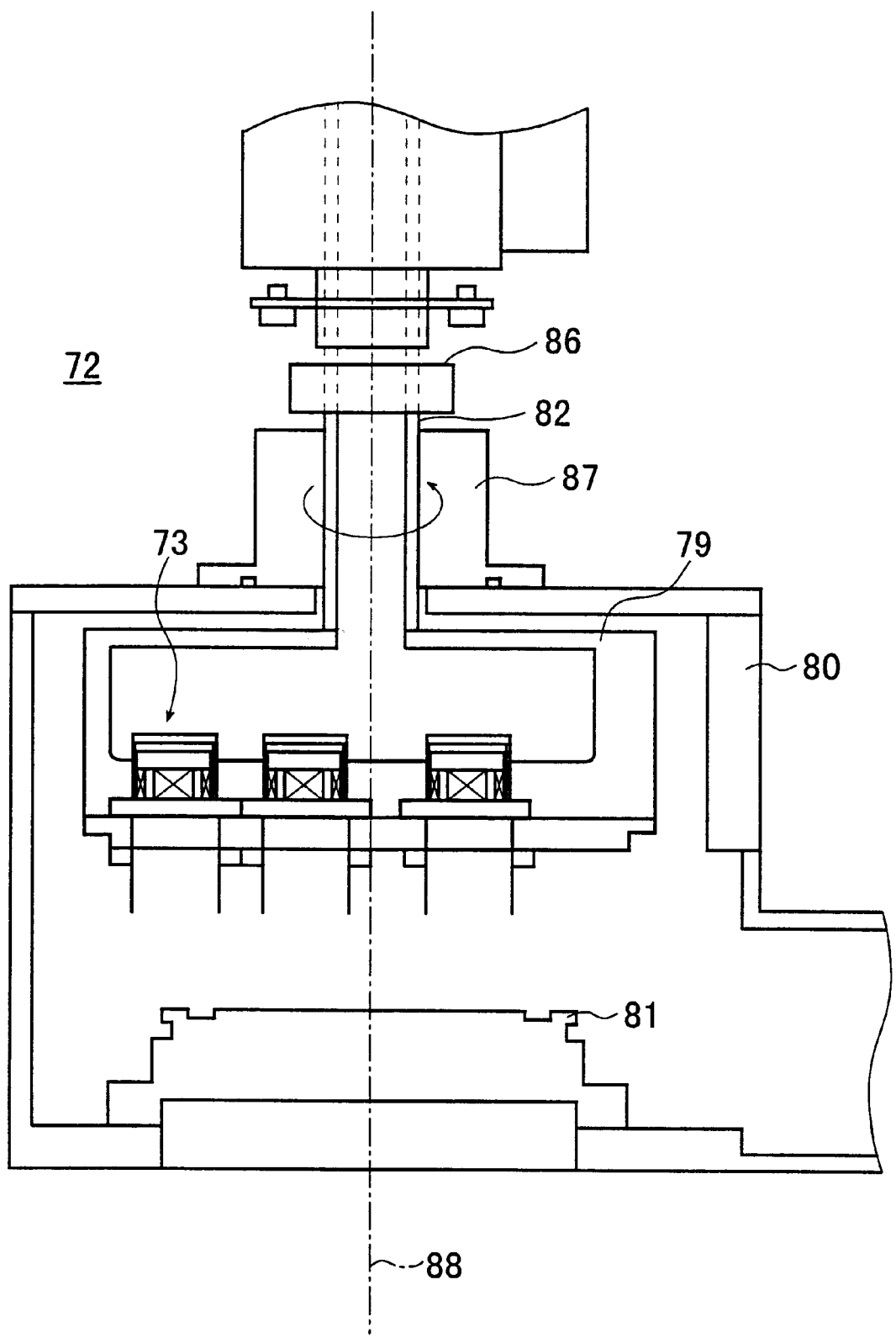
FIG. 7 is a vertical cross-sectional view of a sputtering apparatus according to a third embodiment of the present invention.

FIG. 7 shows a sputtering apparatus 72 according to a third embodiment of the present invention, which is an improvement over the sputtering apparatus 2.

As shown in FIG. 7, the sputtering apparatus 72 generally comprises a vacuum housing 80, a substrate holder 81 mounted on a lower end of the vacuum housing 80, and a cathode holder 79 disposed on an upper end of the vacuum housing 80. The vacuum housing 80 is connected to a vacuum pump (not shown), and can be evacuated thereby.

The cathode holder 79 supports a plurality of (ten in the illustrated embodiment) sputtering cathodes 73 mounted fixedly thereon (only three sputtering cathodes 73 being shown in FIG. 7). The cathode holder 79 and the sputtering cathodes 73 jointly make up a composite sputtering cathode assembly 72.

Figure 8:
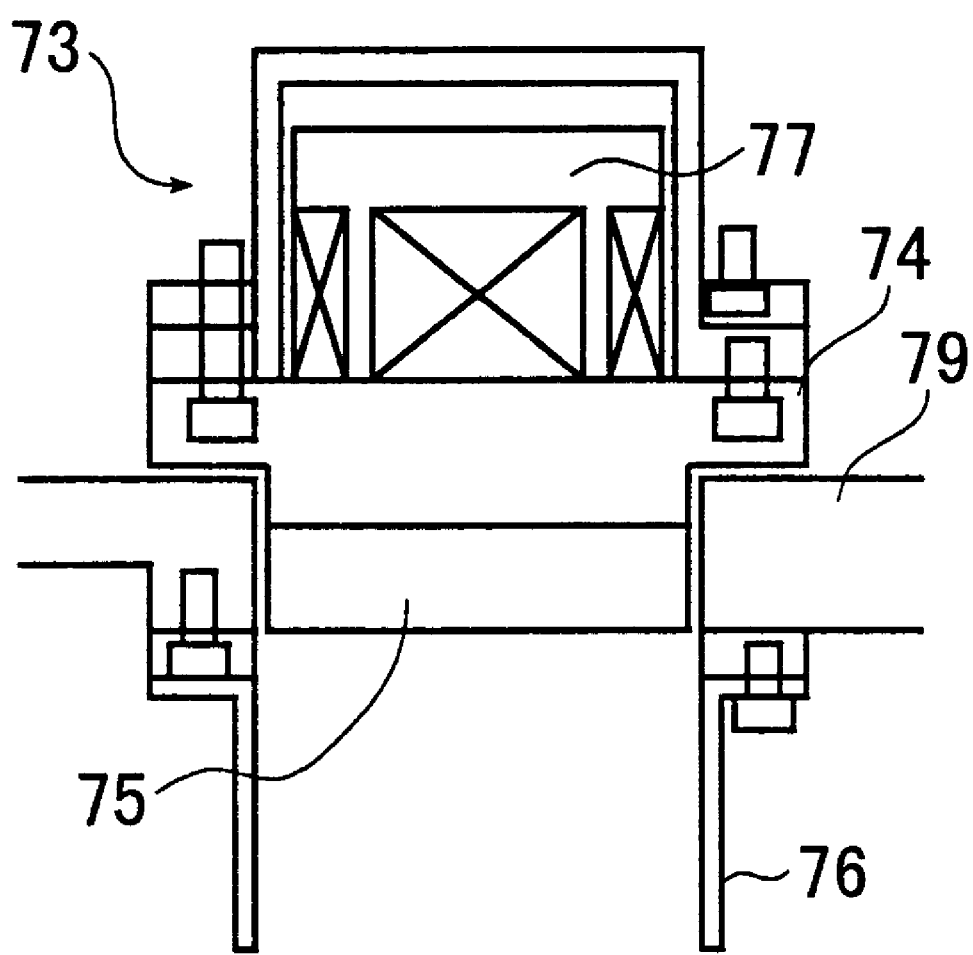
FIG. 8 is a vertical cross-sectional view of a sputtering cathode of the sputtering apparatus shown in FIG. 7.

The sputtering cathodes 73 are identical in structure to the sputtering cathodes $53_1$~$53_6$. As shown in FIG. 8, each of the sputtering cathodes 73 comprises an electrode 74, a target 75, a magnetron magnet 77, and a tubular sleeve 76.

The target 75 is housed in the tubular sleeve 76, and fixed to the surface of the electrode 74 which faces the substrate holder 81. The magnetron magnet 77 is disposed on the opposite surface of the electrode 74.

The tubular sleeve 76 has an upper end secured to the cathode holder 79 with its lower end directed substantially perpendicularly to the substrate holder 81. The target 75 faces the substrate holder 81 through the lower end opening of the tubular sleeve 76.

Figure 9:
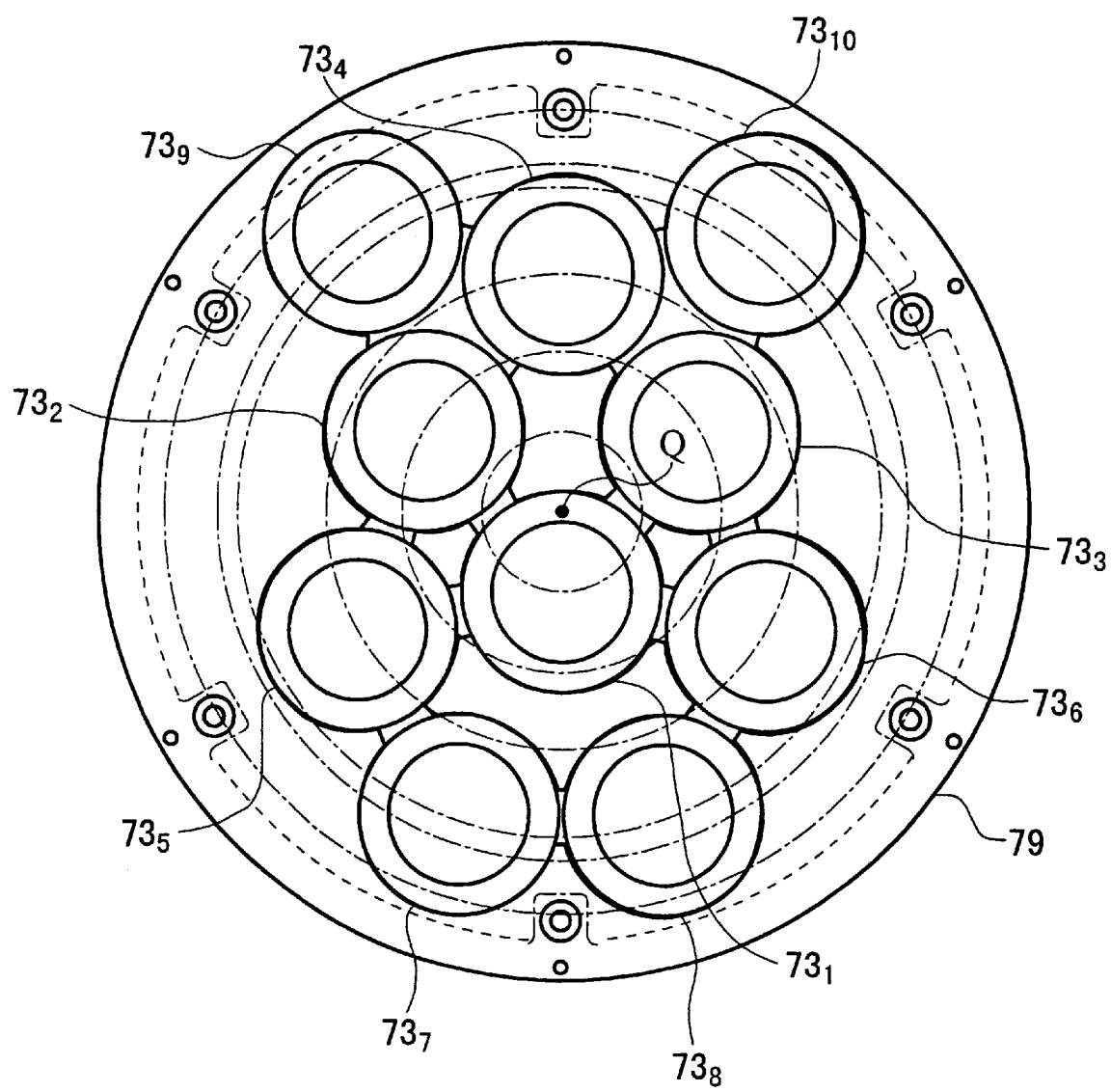
FIG. 9 is a plan view of a composite sputtering cathode assembly of the sputtering apparatus shown in FIG. 7.
Figure 12:
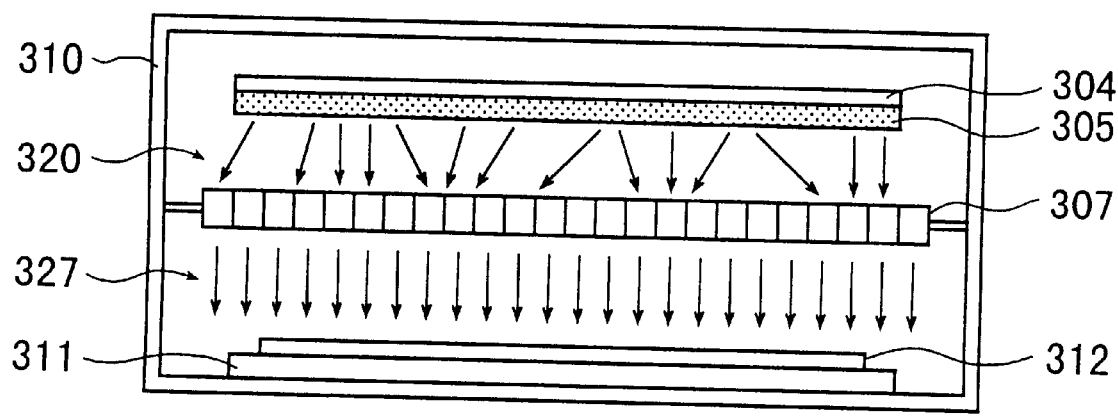
FIG. 12 is a vertical cross-sectional view of a conventional sputtering apparatus which includes a collimator.

FIG. 9 shows a relative positional relationship of the sputtering cathodes 73 and the cathode holder 79. The ten sputtering cathodes 73 are represented by $73_1$~$73_{10}$, respectively, and positioned asymmetrically around a center Q of the cathode holder 79.

A rotatable shaft 82 is perpendicularly attached at its lower end to an upper surface of the cathode holder 79. The rotatable shaft 82 has an upper end portion with a hermetic seal 87 and extending outwardly from the vacuum housing 80, and has an upper end coupled to a motor 86. The seal 87 is mounted on the vacuum housing 80 for maintaining the vacuum in the vacuum housing 80 without a pressure leakage along the shaft 82.

When the motor 86 is energized, the cathode holder 79 and the sputtering cathodes $73_1$~$73_{10}$ are rotated in unison with each other about the center Q which is aligned with a vertical central axis 88 (see FIG. 7) of the rotatable shaft 82.

For sputtering the sputtering cathodes $73_1$~$73_{10}$, a substrate is placed on the substrate holder 81, and the cathode holder 79 is rotated. Though the substrate is held at rest, since sputtering cathodes $73_1$~$73_{10}$ are rotated, the substrate and the composite sputtering cathode 71 rotate relatively to each other. Any point on the surface of the substrate passes through one of the effective regions below the sputtering cathodes 75. Therefore, sputtering particles expelled from the sputtering cathodes 75 are applied perpendicularly to the surface of the substrate.

As described above, the substrate and the composite sputtering cathode 1 are held at rest in the sputtering apparatus 2, and the substrate and the composite sputtering cathodes 51, 71 rotate relatively to each other in the sputtering apparatus 52, 72. Therefore, the sputtering apparatus 52, 72 increase the bottom coverage in the minute holes in the substrate and the uniformity of the distribution of film thicknesses. Rather than rotating the sputtering cathodes, one of the substrate and the sputtering cathodes may be rotated, or the substrate and the sputtering cathodes may be rotated (in the opposite directions or in the same direction), respectively.

In the sputtering apparatus 2, 52, 72, the amounts of electric energy supplied to the respective targets may be different from each other in order to uniformize the distribution of film thicknesses.

If sputtering cathodes over a radially outer area of the substrate are positioned more densely, it is possible to uniformize the distribution of film thicknesses even with equal amounts of electric energy supplied to the respective targets.

Tubular sleeves are employed to shield the targets from each other. However, plate-like shields rather than tubular sleeves may be used to shield the targets from each other.

Those shields may be maintained at a floating potential or any other arbitrary potential. The shields may not be directly fixed to the cathode holders.

The sputtering cathodes may comprise either magnetron cathodes having magnetic circuits or sputtering cathodes free of magnetic circuits.

The sputtering power supplies may apply a DC voltage, an RF voltage, an HF voltage, or a combination of these voltages. A bias voltage which may be a DC voltage, an RF voltage, an HF voltage, or a combination of these voltages may be applied to the substrate.

In the illustrated embodiments, the targets are circular in shape. However, the targets may be of a rectangular shape, a hexagonal shape, or any of various other shapes.

As described above, the composite sputtering cathode assembly and the sputtering apparatus according to the present invention can deposit a thin film on a large substrate with a highly symmetrical bottom coverage for minute holes defined in the substrate. Since the individual targets of the composite sputtering cathode assembly can be reduced in size, the targets can be manufactured with ease and at a low cost. The distribution of film thicknesses can easily be controlled by individually controlling the amount of electric energy supplied to each of the sputtering cathodes. Using the tubular sleeves for shielding the targets from each other allows the interior of the vacuum housing to be easily cleaned.

If targets made of different materials are used, then it is possible to form a thin film made up of different materials distributed transversely across the thin film or a thin film made up of a composite material such as an alloy or the like.

Although certain preferred embodiments of the present invention have been shown and described in detail, it should be understood that various changes and modifications may be made therein without departing from the scope of the appended claims.

What is claimed is:

1. A sputtering apparatus comprising:
   a vacuum housing;
   a cathode holder disposed in said vacuum housing;
   a substrate holder in confronting relation to each of said targets; and
   a plurality of shields each disposed between adjacent ones of said targets,
   each of said targets being positioned asymmetrically around a center of said cathode holder,
   said shields having tip ends spaced from a surface of said target by a distance which is at least a diameter of said target, and
   said cathode holder and said substrate holder being rotated relatively to each other,
   wherein each of said targets has a radius which is greater than the distance between an arc of a concentric circle one of said targets has its center thereon and another arc of an adjacent one when concentric circles having a center of a relative rotation on said cathode holder as their centers and circumferences thereof pass through respective centers of said targets.

2. A sputtering apparatus according to claim 1, wherein each of said shields comprises a tubular sleeve;
   each of said tubular sleeves has a tip end facing to said substrate holder, and each of said targets is in confronting relation to said substrate holder via said tubular sleeve.

3. A sputtering apparatus according to claim 1, wherein each of said cathode electrodes is connected to a power supply to generate sputtering gas plasmas on the surface of each of said targets, and electric power supplied to each of said cathode electrodes can be controlled individually.

4. A sputtering apparatus according to claim 1, wherein a plurality of said targets includes a target of different materials.

5. A sputtering apparatus according to claim 1, wherein a plurality of said targets includes differently sized targets.

6. A sputtering apparatus comprising:
   a vacuum housing;
   a cathode holder disposed in said vacuum housing;
   a plurality of cathode electrodes held by said cathode holder;
   a plurality of targets, each being disposed in a respective one of said cathode electrodes;
   a substrate holder in confronting relation to each of said targets; and
   a plurality of shields each disposed between adjacent ones of said targets,
   said shields having tip ends spaced from a surface of said target by a distance which is at least a diameter of said target,
   said cathode holder and said substrate holder being rotated relatively to each other, and
   each of said targets having a radius which is greater than the distance between an arc of a concentric circle one of said targets has its center thereon and another arc of an adjacent one when concentric circles having a center of a relative rotation on said cathode holder as their centers and circumferences thereof pass through respective centers of said targets.

7. A sputtering apparatus according to claim 6, wherein each of said shields comprises a tubular sleeve,
   each of said tubular sleeves has a tip end facing to said substrate holder, and each of said targets is in confronting relation to said substrate holder via said tubular sleeve.

8. A sputtering apparatus according to claim 6, wherein each of said cathode electrodes is connected to a power supply to generate sputtering gas plasmas on the surface of each of said targets, and electric power supplied to each of said cathode electrodes can be controlled individually.

9. A sputtering apparatus according to claim 6, wherein a plurality of said targets includes a target of different materials.

10. A sputtering apparatus according to claim 6, wherein a plurality of said targets includes differently sized targets.

11. A sputtering apparatus comprising:

a vacuum housing;

a cathode holder disposed in said vacuum housing;

a plurality of cathode electrodes held by said cathode holder;

a plurality of targets, each being disposed in respective one of said cathode electrodes;

a substrate holder in confronting relation to each of said targets;

a plurality of shields each disposed between adjacent ones of said targets;

wherein only sputtering particles emitted in a substantially perpendicular direction to the substrate among sputtering particles emitted from said target can reach the surface of the substrate set on said substrate holder, each of said targets is positioned asymmetrically around a center of said cathode holder, and said cathode holder and said substrate holder are rotated relatively to each other, wherein each of said targets has a radius which is greater than the distance between an arc of a concentric circle one of said targets has its center thereon and another arc of an adjacent one when concentric circles having a center of a relative rotation on said cathode holder as their centers and circumferences thereof pass through respective centers of said targets.

12. A sputtering apparatus according to claim 11, wherein each of said shields comprises a tubular sleeve, each of said tubular sleeves has a tip end facing to said substrate holder, and each of said targets is in confronting relation to said substrate holder via said tubular sleeve.

13. A sputtering apparatus according to claim 11, wherein each of said cathode electrodes is connected to a power supply to generate sputtering gas plasmas on the surface of each of said targets, and electric power supplied to each of said cathode electrodes can be controlled individually.

14. A sputtering apparatus according to claim 11, wherein a plurality of said targets includes a target of different materials.

15. A sputtering apparatus according to claim 11, wherein a plurality of said targets includes differently sized targets.

16. A sputtering apparatus comprising:

a vacuum housing;

a cathode holder disposed in said vacuum housing;

a plurality of cathode electrodes held by said cathode holder;

a plurality of targets, each being disposed in respective one of said cathode electrodes;

a substrate holder in confronting relation to each of said targets;

a plurality of shields each disposed between adjacent ones of said targets;

wherein only sputtered particles emitted substantially perpendicular direction to the substrate among sputtered particles emitted from said target can reach the surface of the substrate set on said substrate holder, each of said targets is positioned asymmetrically around a center of said cathode holder, and said cathode holder and said substrate holder are rotated relatively to each other, wherein each of said targets has a radius which is greater than the distance between an arc of a concentric circle one of said targets has its center thereon and another arc of an adjacent one when concentric circles having a center of relative rotation on said cathode holder as their centers and circumferences thereof pass through respective centers of said targets.

17. A sputtering apparatus according to claim 16, wherein each of said shields comprises a tubular sleeve, each of said tubular sleeves has a tip end facing to said substrate holder, and each of said targets is in confronting relation to said substrate holder via said tubular sleeve.

18. A sputtering apparatus according to claim 16, wherein each of said cathode electrodes is connected to a power supply to generate sputtering gas plasmas on the surface of each of said targets, and electric power supplied to each of said cathode electrodes can be controlled individually.

19. A sputtering apparatus according to claim 16, wherein a plurality of said targets include a target of different materials.

20. A sputtering apparatus according to claim 16, wherein a plurality of said targets include differently sized targets.

* * * * *